US007117382B2

(12) United States Patent
Khieu et al.

(10) Patent No.: US 7,117,382 B2
(45) Date of Patent: Oct. 3, 2006

(54) VARIABLY CONTROLLED DELAY LINE FOR READ DATA CAPTURE TIMING WINDOW

(75) Inventors: Cong Q. Khieu, San Jose, CA (US); Louise Gu, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 476 days.

(21) Appl. No.: 10/159,090

(22) Filed: May 30, 2002

(65) Prior Publication Data

US 2003/0226053 A1  Dec. 4, 2003

(51) Int. Cl.
*G06F 1/04* (2006.01)
*G06F 1/12* (2006.01)
*H03L 7/00* (2006.01)
(52) U.S. Cl. .............. 713/401; 713/400; 713/500; 713/503; 713/600; 327/161
(58) Field of Classification Search ............... 713/401
See application file for complete search history.

(56) References Cited

U.S. PATENT DOCUMENTS

| | | | |
|---|---|---|---|
| 4,660,197 A | 4/1987 | Wrinn et al. | |
| 5,537,062 A | 7/1996 | Mote, Jr. | |
| 5,633,608 A | 5/1997 | Danger | |
| 5,900,762 A | 5/1999 | Ramakrishnan | |
| 5,955,894 A | 9/1999 | Vishwanthaiah et al. | |
| 5,999,978 A | 12/1999 | Angal et al. | |
| 6,043,694 A | 3/2000 | Dortu | |
| 6,060,907 A | 5/2000 | Vishwanthaiah et al. | |
| 6,064,656 A | 5/2000 | Angal et al. | |
| 6,085,033 A | 7/2000 | Starr et al. | |
| 6,212,511 B1 | 4/2001 | Fisher et al. | |
| 6,253,333 B1 * | 6/2001 | Bogumil et al. ............ 713/503 |
| 6,278,306 B1 | 8/2001 | Ang et al. | |
| 6,281,729 B1 | 8/2001 | Ang et al. | |
| 6,294,924 B1 | 9/2001 | Ang et al. | |
| 6,297,677 B1 | 10/2001 | Ang et al. | |
| 6,316,957 B1 | 11/2001 | Ang et al. | |
| 6,339,351 B1 | 1/2002 | Ang et al. | |
| 6,366,139 B1 | 4/2002 | Ang et al. | |
| 6,407,963 B1 | 6/2002 | Sonoda et al. | |
| 6,420,913 B1 | 7/2002 | Ang et al. | |
| 6,424,198 B1 | 7/2002 | Wolford | |
| 6,467,043 B1 | 10/2002 | LaBerge | |
| 6,600,681 B1 | 7/2003 | Korger et al. | |
| 6,622,256 B1 * | 9/2003 | Dabral et al. ............... 713/600 |
| 6,695,783 B1 * | 2/2004 | Henderson et al. ......... 600/443 |
| 6,738,880 B1 * | 5/2004 | Lai et al. .................... 711/167 |
| 6,963,989 B1 * | 11/2005 | Cullum et al. ............. 713/401 |
| 2001/0052057 A1 * | 12/2001 | Lai et al. .................... 711/154 |

(Continued)

*Primary Examiner*—James K. Trujillo
(74) *Attorney, Agent, or Firm*—Zagorin O'Brien Graham LLP

(57) ABSTRACT

Disclosed is a method and circuit for variably controlling a delay line for a read data capture timing window. In one embodiment, the circuit includes a variably controlled delay circuit coupled to a FIFO. The variably controlled delay circuit receives an input strobe signal. The variably controlled delay circuit also receives a multibit control code. The variably controlled delay circuit transmits the input strobe signal after a time delay, wherein the time delay varies according to the multibit control code. The FIFO is coupled to the variably controlled delay circuit and receives the time delayed strobe signal therefrom. The FIFO receives an input data bit signal. The FIFO stores the input data bit signal in response to receiving the time delayed strobe signal.

20 Claims, 5 Drawing Sheets

U.S. PATENT DOCUMENTS

2003/0001651 A1   1/2003   La Rosa
2004/0123173 A1   6/2004   Emberling et al.
2004/0225976 A1   11/2004  Cheung et al.

* cited by examiner ary delay line for read data capture timing window. In one
VARIABLY CONTROLLED DELAY LINE FOR READ DATA CAPTURE TIMING WINDOW

BACKGROUND OF THE INVENTION

FIG. 1 illustrates a microprocessor 10 coupled to a memory device 12 via data bus 14. Data bus 14 includes a plurality of conductive lines (not shown) for transmitting data bit signals and a strobe signal in parallel between memory device 12 and microprocessor 10. As used herein, a memory device may include SRAMs, DRAMs, or other memory capable of storing digital data.

Microprocessor 10 includes a plurality of input/output ("I/O") devices (not shown in FIG. 1) coupled to respective conductive lines of data bus 14. These I/O devices are capable of transmitting or receiving data bit signals. FIG. 2 shows relevant components of I/O devices of microprocessor 10. More particularly, FIG. 2 shows a plurality of FIFOs 20(0) through 20(n) each one of which is contained in a respective I/O device. FIG. 2 also shows a strobe buffer 22. Lastly, FIG. 2 shows a plurality of data buffers 24(0) through 24(n) each one of which is contained in a respective I/O device.

Data buffers 24(0) through 24(n) are coupled between respective data inputs of FIFOs 20(0) through 20(n) and respective conductive lines of data bus 14. The output of strobe buffer 22 is coupled between a conductive line of data bus 14 and FIFOs 20(0) through 20(n). For purposes of definition, two devices (e.g., a buffer and a FIFO) may be coupled together directly by a conductor or data link, or indirectly via a third device. For example, FIG. 2 show data buffers 24(0) through 24(n) coupled directly to data inputs of FIFOs 20(0) through 20(n), respectively. Further, although not shown, buffers 24(0) through 24(n) are coupled indirectly to respective data bus lines via output bumps of microprocessor 10 and conductive traces of a semiconductor packaging in which microprocessor is contained.

Data bus 14 transmits the strobe signal in parallel with data bit signals. The strobe signal is essentially a clock having a 50% duty cycle. Memory 12 transmits data at a double data rate (DDR). More particularly, I/O devices of memory 12 transmit a set of data bit signals $D_{in}(0)$ through $D_{in}(n)$ with each transition edge (i.e., a rising edge and falling edge) of the strobe signal.

Data bit signals $D_{in}(0)$ through $D_{in}(n)$ are received by data buffers 24(0) through 24(n) around the same time strobe buffer 22 receives the transition edges of the strobe signal. Buffers 22 and 24(0) through 24(n), when the enable signal provided thereto are asserted, transmit the strobe signal and data bit signals $D_{in}(0)$ through $D_{in}(n)$ to FIFOs 20(0) through 20(n).

FIFOs 20(0) through 20(n) capture or store data bit signals $D_{in}(0)$ through $D_{in}(n)$, respectively, upon the transition edges of the strobe signal provided thereto by strobe buffer 22. FIFOs 20(0) through 20(n) store data bit signals $D_{in}(0)$ through $D_{in}(n)$, respectively, for subsequent processing by the core of microprocessor 10. It is essential that that FIFOs 20(0) through 20(n) receive the transition edges of the strobe signal during a read data capture timing window. The read data capture timing window is a period of time when: (1) all data bit signals $D_{in}(0)$ through $D_{in}(n)$ are present at the inputs of FIFOs 20(0) through 20(n) with sufficient set-up time before FIFOs 20(0) through 20(n) receive transition edges of the strobe signal from buffer 22, and; (2) all data bit signals $D_{in}(0)$ through $D_{in}(n)$ are present at the inputs of FIFOs 20(0) through 20(n) with sufficient hold time after FIFOs 20(0) through 20(n) receive the transition edges of the strobe signal from buffer 22. If the transition edges of the strobe signal do not arrive at FIFOs 20(0) through 20(n) during the read capture timing window, false data will be stored in FIFOs 20(0) through 20(n).

Transmission of the strobe signal and data bit signals $D_{in}(0)$ through $D_{in}(n)$ between memory device 12 and FIFOs 20(0) through 20(n), are subject to unexpected delays. Because of relative delays in the transmission of the data bit signals $D_{in}(0)$ through $D_{in}(n)$ to the inputs of FIFOs 20(0) through 20(n), the read capture timing window may be substantially small. Additionally, because of unexpected delays, the transition edges of the strobe signal may arrive at FIFOs 20(0) through 20(n) with an unexpected delay relative to the read capture timing window.

A variety of factors induce transmission delay in the data bit and strobe signals. For example, the conductive line of bus 14 that transmits the strobe signal may be shorter or longer in length than one or more of the conductive lines of bus 14 that transmit the data bit signals. Another source of relative signal delay relates to variations in the process used to manufacture microprocessor 10. Microprocessors are manufactured using complex equipment and processes. Variations in the equipment and processes may result in unexpected physical variations of the structure of, for example, the transistors in strobe buffer 22. These physical variations in transistor structure may introduce unexpected delays in the strobe signal transmitted through strobe buffer 22.

The unexpected delays described above are fixed. Delays in the strobe and data bit signals may vary. For example, delays in the strobe signal may vary during operation of the microprocessor due to changes in temperature of strobe buffer 22 or changes in the power supply voltage provided to strobe buffer 22. Increases in operating temperature of strobe buffer 22 will typically increase delay in strobe signal transmission therethrough, and vice versa. An increase power supply voltage provided to strobe buffer 22 will typically decrease delay in strobe signal transmission therethrough, and vice versa.

As noted above, the transition edges of strobe signal and the data bit signals $D_{in}(0)$ through $D_{in}(n)$ are received by buffers of microprocessor 12 around the same point in time. FIG. 3 is a timing diagram illustrating the data bit signal $D_{in}(0)$ and the strobe signal provided to inputs of FIFO 20(0). Except for relative delays between data signals, inputs to the remaining FIFOs 20(1) through 20(n) are identical. Strobe buffer 22 is designed to delay transmission of the strobe signal by a fixed amount of time (e.g., 25% of the strobe signal's duty cycle) so that FIFOs 20(0) through 20(n) receive the transition edges (e.g., rising edge at time=$t_1$) within a read capture timing window thereof.

FIG. 3 illustrates the relative effects of unexpected delays on the strobe signal. In FIG. 3, unexpected delays may cause the transition edges of the strobe signal to move in time relative to data bit signal $D_{in}(0)$ in either the $D_{positive}$ or $D_{negative}$ directions by an undetermined magnitude. Unfortunately, if the magnitude of $D_{positive}$ or $D_{negative}$ is great enough, the transition edges of the strobe signal may fall outside the read capture timing window.

SUMMARY OF THE INVENTION

Disclosed is a method and circuit for variably controlling a delay line for read data capture timing window. In one embodiment, the circuit includes a variably controlled delay circuit coupled to a FIFO. The variably controlled delay circuit receives an input strobe signal. The variably controlled delay circuit also receives a multibit control code. The variably controlled delay circuit transmits the input strobe signal after a time delay, wherein the time delay varies according to the multibit control code. The FIFO is coupled to the variably controlled delay circuit and receives the time delayed strobe signal therefrom. The FIFO receives an input data bit signal. The FIFO stores the input data bit signal in response to receiving the time delayed strobe signal.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

Figure 1:
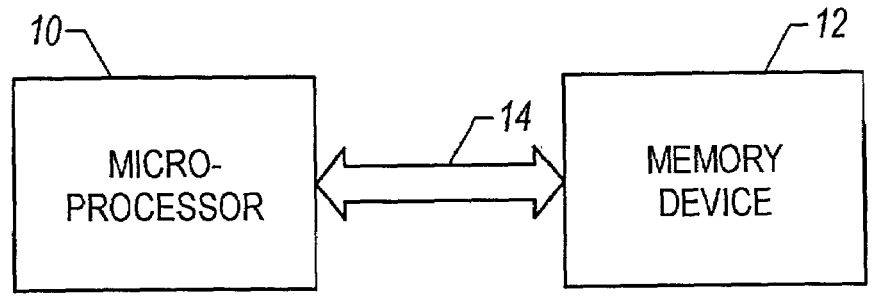
FIG. 1 illustrates a microprocessor coupled to a memory device.
Figure 2:
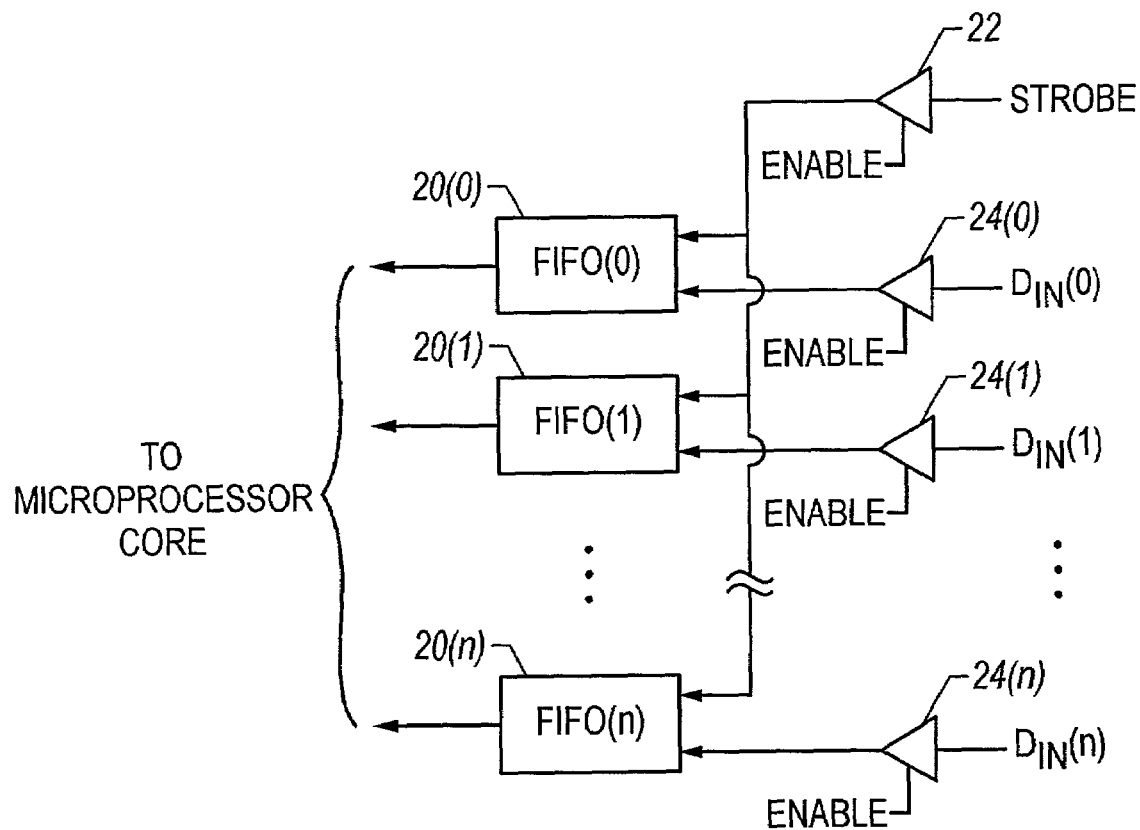
FIG. 2 illustrates relevant components of I/O devices of the microprocessor shown in FIG. 1.
Figure 3:
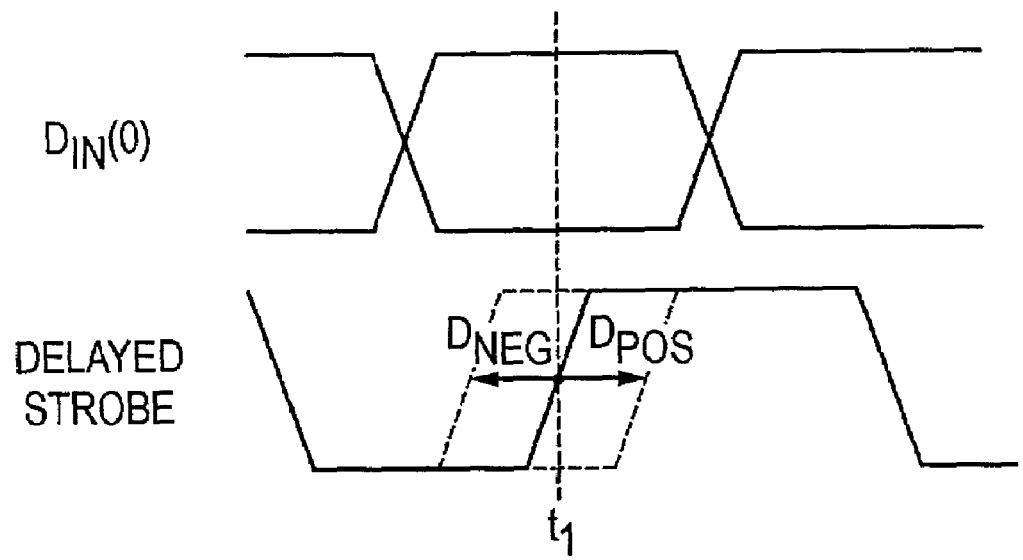
FIG. 3 illustrates relative effects of delays on the strobe signal received by the FIFOs of FIG. 2.

While the invention is susceptible to various modifications and alternative forms, specific embodiments thereof are shown by way of example in the drawings and will herein be described in detail. However, the drawings and detailed description thereto are not intended to limit the invention to the particular form disclosed. On the contrary, the intention is to cover all modifications, equivalents, and alternatives falling within the spirit and scope of the present invention as defined by the appended claims.

DETAILED DESCRIPTION

Computer systems, including computer servers, employ one or more microprocessors coupled to one or more memory devices, via a serial or parallel data bus. The present invention will be described with reference to a microprocessor coupled to a memory device via a parallel data bus, it being understood that the present invention should not be limited thereto. The term device includes circuits of transistors coupled together to perform an electronic function.

Figure 4:
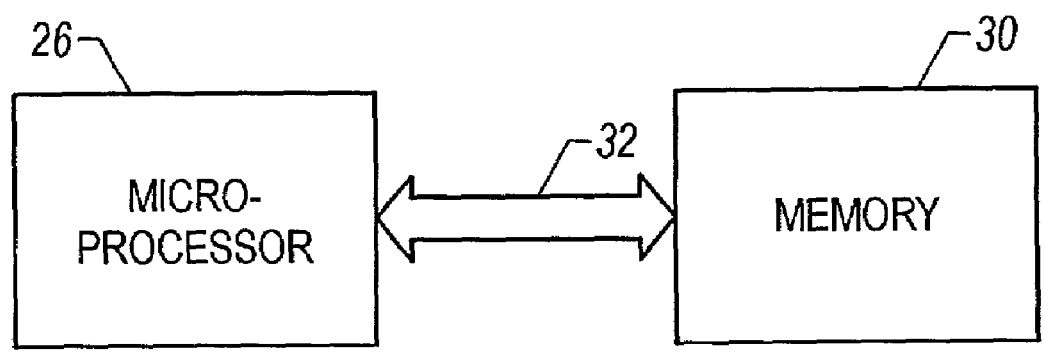
FIG. 4 illustrates a microprocessor coupled to a memory device.

FIG. 4 is a block diagram illustrating a microprocessor 26 coupled to a memory device 30 via a data bus 32. Microprocessor 26 employs the present invention. The present invention may find application in devices other than a microprocessor and should not be limited to use in a microprocessor. For example, the present invention may find application in memory 30.

Data bus 32 includes a plurality of conductive lines (not shown) for transmitting data bit signals and a strobe signal in parallel between memory device 30 and microprocessor 26. Microprocessor 26 includes a plurality of I/O devices (not shown in FIG. 4) coupled to respective conductive lines of data bus 32. These I/O devices are capable of transmitting or receiving data bit signals.

Figure 5:
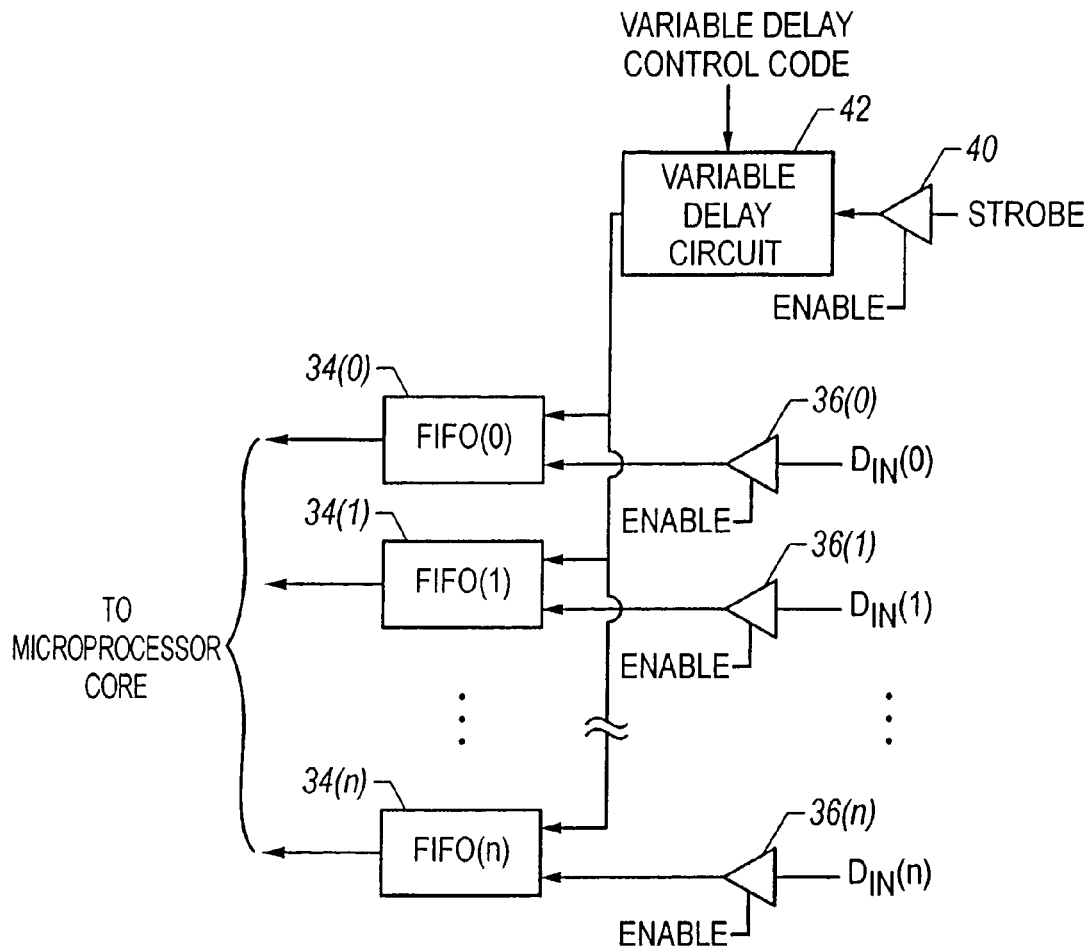
FIG. 5 shows relevant components of I/O devices of the microprocessor of FIG. 4.

FIG. 5 shows relevant components of I/O devices of microprocessor 10. More particularly, FIG. 5 shows a plurality of FIFOs 34(0) through 34(n) each one of which is contained in a respective I/O device. FIG. 5 shows a plurality of data buffers 36(0) through 36(n) each one of which is contained in a respective I/O device of microprocessor 26. FIG. 5 shows a strobe buffer 40. Lastly, FIG. 5 shows a variable control delay circuit 42.

Data buffers 36(0) through 36(n) are coupled between respective data inputs of FIFOs 34(0) through 34(n) and respective conductive lines of data bus 32. Although not shown, buffers 36(0) through 36(n) are coupled to respective data bus lines via output bumps of microprocessor 26 and conductive traces of a semiconductor packaging in which microprocessor 26 is contained. The output of strobe buffer 40 is coupled between a conductive line of data bus 14 and variable delay circuit 42. The output of variable delay circuit 42 is coupled to FIFOs 34(0) through 34(n).

Data bus 32 transmits the strobe signal in parallel with data bit signals. In one embodiment, the strobe signal is essentially a clock signal having a 50% duty cycle. Memory 30 transmits data at DDR. The present invention, it is understood, should not be limited to use in a system employing a DDR data bus.

Data bit signals $D_{in}(0)$ through $D_{in}(n)$ are received by data buffers 36(0) through 36(n) around the same time strobe buffer 40 receives transition edges of the strobe signal. Buffers 36(0) through 36(n), when the enable signals provided thereto are asserted, transmit the strobe signals and data bit signals $D_{in}(0)$ through $D_{in}(n)$ to FIFOs 34(0) through 34(n). Buffer 40 transmits the strobe signal to variable delay circuit 42. Variable delay circuit 42 transmits the strobe signal to FIFOs 34(0) through 34(n).

FIFOs 34(0) through 34(n) capture or store data bit signals $D_{in}(0)$ through $D_{in}(n)$, respectively, upon the transition edges of the strobe signal provided thereto by variable delay circuit 42. It is essential that FIFOs 34(0) through 34(n) receive the transition edges of the strobe signal during the read capture timing window thereof.

Figure 6:
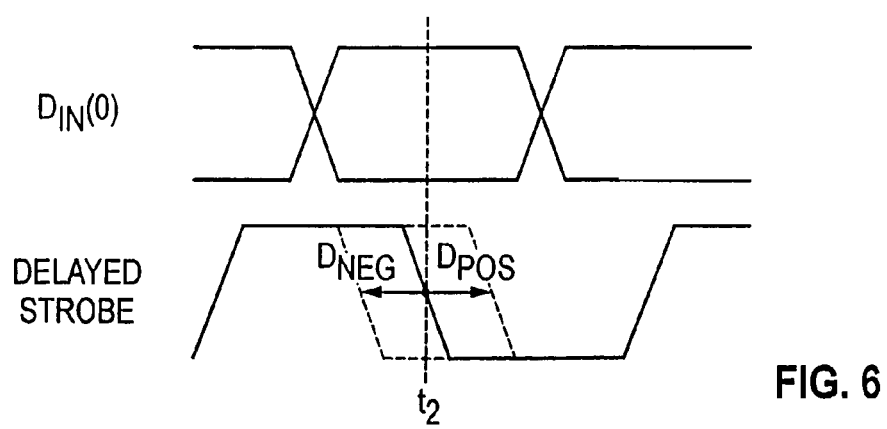
FIG. 6 illustrates relative effects of delays on the strobe signal received by the FIFOs of FIG. 5.

The data bit signals $D_{in}(0)$ through $D_{in}(n)$ and/or the strobe signal may be subject to one or more of the unexpected fixed or variable delays mentioned above. Variable delay circuit 42 operates to offset the one or more unexpected fixed or variable delays of strobe signal transmission. FIG. 6 is a timing diagram illustrating the data bit signal $D_{in}(0)$ and the strobe signal provided to inputs of FIFO 34(0). Except for relative delays between data signals, inputs to the remaining FIFOs 34(1) through 34(n) are identical. FIG. 6 shows the strobe signal after delayed transmission by variable delay circuit 42. Variable delay circuit delays the strobe signal by a first delay time in response to receiving a first variable delay control code. Ideally, the strobe signal is delayed by variable delay circuit 42 so that its transition edges (e.g., the falling edge at time=$t_2$) fall within the read capture timing window of FIFOs 34(1) through 34(n).

With continuing reference to FIGS. 5 and 6, during operation, one or more variable delays may unexpectedly cause the transition edges of the strobe signal to drift in either the $D_{positive}$ or $D_{negative}$ directions by an undetermined magnitude. For example, the temperature of strobe buffer 40 may decrease or the magnitude of the power supply provided to buffer 40 may increase thereby causing the transition edges of the strobe signal to drift in the $D_{negative}$ direction. This drift may cause the transition edges to fall outside the read capture timing window. In response to a decrease in temperature, an increase in the power supply voltage, or both, a second variable delay code may be generated. The variable delay circuit 42 receives the second variable delay code, and in response variable delay circuit 42 increases the delay of strobe signal transmission therethrough so that the transition edges of the strobe signal move in the $D_{positive}$ direction. After further operation, the temperature of strobe buffer 40 may increase or the magnitude of the power supply provided to buffer 40 may decrease thereby causing the transition edges of the strobe signal to drift in the $D_{positive}$ direction. This drift may cause the transition edges to again fall outside the read capture timing window. In response to an increase in temperature, a decrease in the power supply voltage, or both, a third variable delay code may be generated. The variable delay circuit 42 receives the third variable delay code, and in response variable delay circuit 42 decrease the delay of strobe signal transmission therethrough so that the transition edges of the strobe signal move in the $D_{negative}$ direction.

A variable delay control code generator (not shown) is provided for generating an initial and subsequent variable control delay codes to variable delay circuit 42. In one embodiment, the variable delay control code generator generates the initial variable delay control code in response to: an initial temperature of the variable delay control code generator, the microprocessor 26, the strobe buffer 42, and/or one or more of the data buffers 34(0) through 34(n); an initial magnitude of the power supply voltage provided to the variable delay circuit, the microprocessor 10, the strobe buffer and/or one or more of the data buffers 34(0) through 34(n); unexpected variations in the transistors that form the variable delay control code generator, the microprocessor 26, the strobe buffer 42, and/or one or more of the data buffers 34(0) through 34(n); or other factors; or any combination of the foregoing factors. In one embodiment, the variable delay code generator generates the subsequent variable delay codes in response to: a change in temperature of the variable delay control code generator, the microprocessor 26, the strobe buffer 42, and/or one or more of the data buffers 34(0) through 34(n); a change in the magnitude of the power supply voltage provided to the variable delay circuit, the microprocessor 10, the strobe buffer and/or one or more of the data buffers 34(0) through 34(n); or any combination of the foregoing factors. In one embodiment, the variable delay control code represents an average of a pull up control code and a pull down control code. The pull up and pull down control codes can be generated by circuits described in U.S. Pat. No. 6,060,907 which is incorporated herein by reference in its entirety. The average of pull up and pull down control codes can be generated by a circuit described in copending U.S. patent application Ser. No. 10/158,695 filed May 30, 2002, entitled Average Code Generation Circuit by Cong Khieu and Louise Gu, which is incorporated herein by reference in its entirety.

Figure 7:
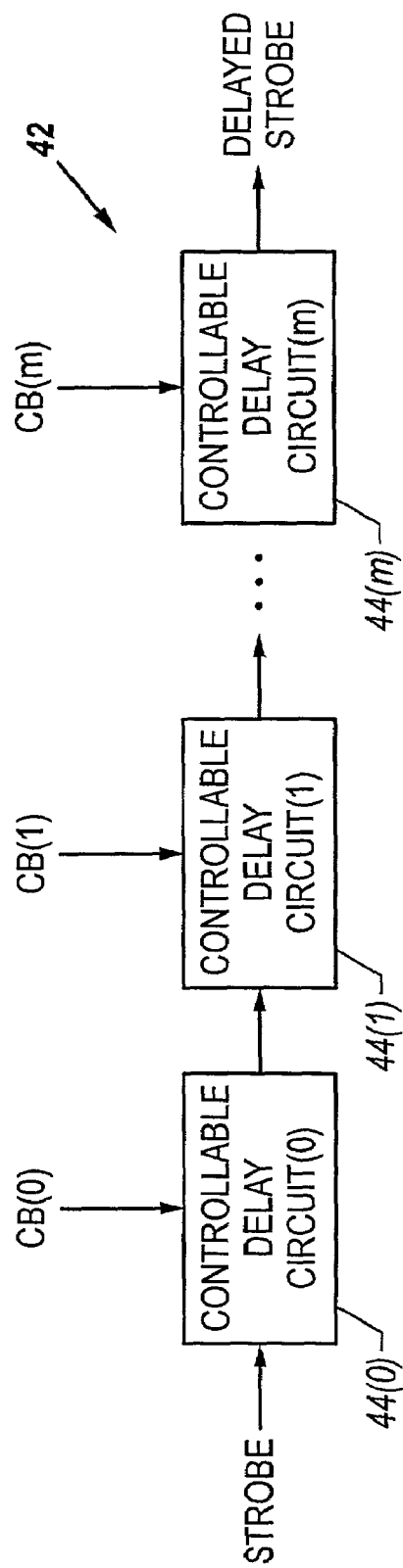
FIG. 7 illustrates one embodiment of the variable delay circuit employed in FIG. 5.

Variable delay circuit 42, as noted above, operates to adjust strobe signal delay in accordance with the variable delay code provided thereto. FIG. 7 illustrates in block diagram form, one embodiment of the variable delay circuit 42. More particularly, variable delay circuit 42 of FIG. 7 includes controllable delay circuits 44(0) through 44(m) coupled in series between strobe signal input and a strobe signal output. In operation, controllable delay circuit 44(0) receives the strobe signal. Controllable delay circuits 44(0) through 44(m) receive control bits CB(0) through CB(m), respectively, of the variable delay control code provided to variable delay circuit 42.

In one embodiment, each controllable delay circuit 44(0) through 44(m) transmits the strobe signal provided at its input via a short transmission delay circuit or a long transmission delay circuit. The transmission delays of the two circuits are distinct from each other. The transmission circuit used to transmit the strobe signal in each of the delay circuits 44(0) through 44(m) depends on the control bit provided thereto. For example, controllable delay circuit 44(0) transmits the strobe signal to controllable delay circuit 44(1) via the short transmission delay circuit of controllable delay circuit 44(0) if CB(0) provided thereto is as a logical one. In contrast, if CB(0) is provided to controllable delay circuit 44(0) as a logical zero, then controllable delay circuit 44(0) transmits the strobe signal via its long transmission delay circuit. Each of the controllable delay circuits 44(0) through 44(m) operates in a substantially similar manner.

The time delay of the short transmission delay circuits in the controllable delay circuits 44(0) through 44(m) may be equal to each other in one embodiment or different from each other in another embodiment. The time delay of the long transmission delay circuits of the controllable delay circuits 44(0) through 44(m) may be equal to each other in one embodiment or different from each other in another embodiment.

Figure 8:
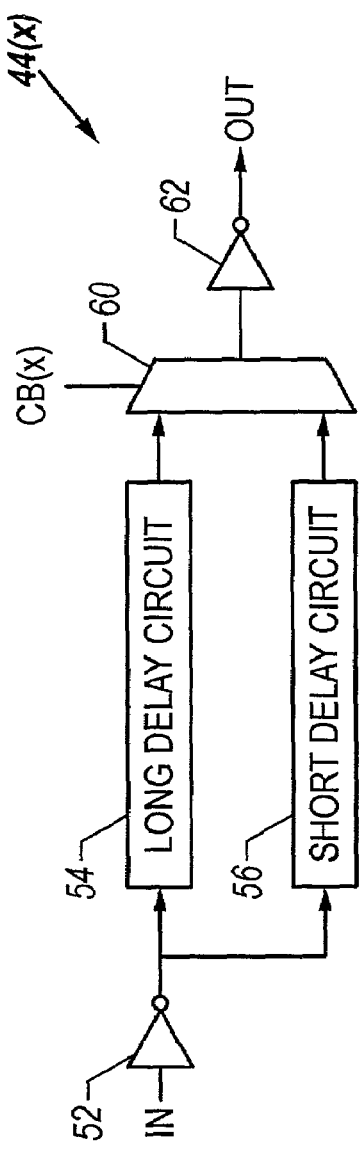
FIG. 8 illustrates one embodiment of one of the controllable delay circuits shown in FIG. 7.

FIG. 8 illustrates one embodiment of one of the controllable delay circuits 44(x) shown in FIG. 7. More particularly, FIG. 8 shows an inverting gate 52, a long transmission delay circuit 54, a short transmission delay circuit 56, a multiplexer 60, and an inverting gate 62. The long transmission delay circuit 54 has an input and an output between which a signal is transmitted. Signals are transmitted through long transmission delay circuit 54 with a time delay $T_{long}$. Short transmission delay circuit includes an input and an output between which signals are transmitted with a time delay $T_{short}$. $T_{long}$ is greater than $T_{short}$.

The outputs of the long and short transmission delay circuits 54 and 56, respectively, are provided to inputs of multiplexer 60. A selector input or a control input receives one of the bits CB(x) of the variable delay control code. In response to receiving CB(x), multiplexer 60 selects or multiplexes one of the inputs to its output, which in turn is provided to inverting gate 62. Thus, controllable delay circuit 44 shown in FIG. 8 has a variable delay between its input and output which depends upon the state of the control bit CB(x) provided thereto.

Figure 9:
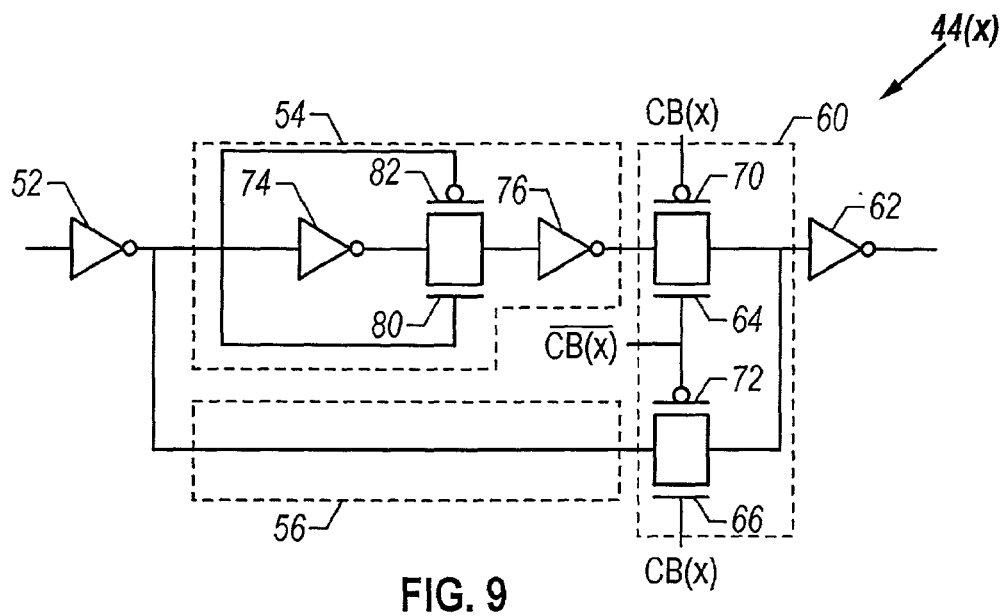
FIG. 9 illustrates one embodiment of a controllable delay circuit shown in FIG. 8.

FIG. 9 illustrates one embodiment of a controllable delay circuit 44(x) shown in FIG. 8. More particularly, FIG. 9 shows that multiplexer 60 consists of a pair of n-channel field effect transistors (FETs) 64 and 66 and a pair of p-channel FETs 70 and 72. The long transmission delay circuit 54 shown in FIG. 9 includes a pair of inverter gates 74 and 76, n-channel FET 80, and p-channel FET 82. It is noted that the inverse of control bit CB(x) is provided to the gates of n-channel FET 64 and p-channel FET 72. The inverse of CB(x) may be provided by a separate inverter (not shown) contained within the controllable delay circuit 44(x) shown in FIG. 9. As will be appreciated by one of ordinary skill in the art, the signal transmission delay of circuit 54, will be longer than the signal delay transmission of circuit 56.

Figure 10:
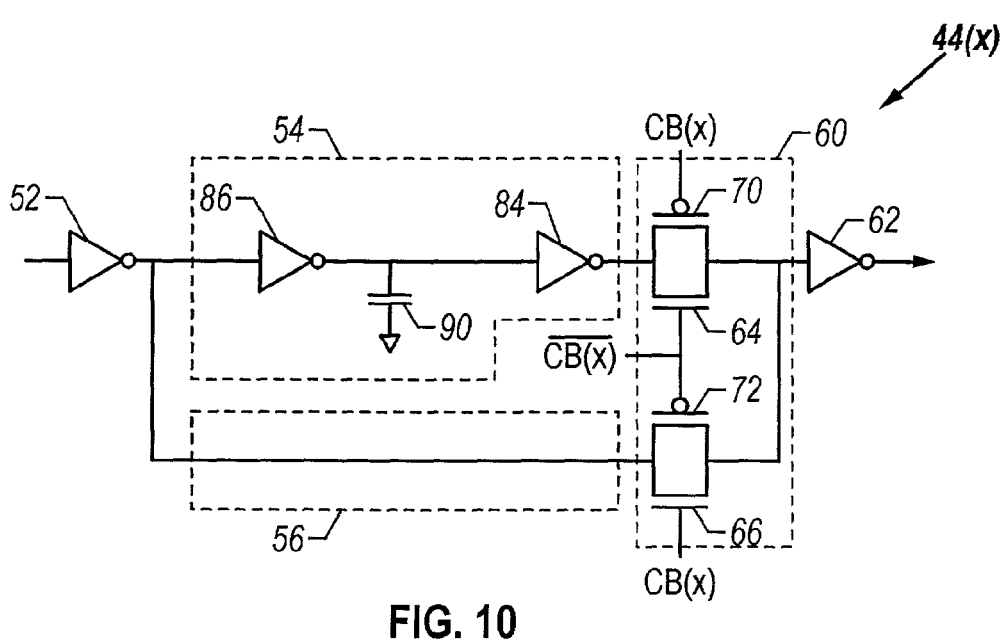
FIG. 10 illustrates another embodiment of the controllable delay circuit of FIG. 8.

FIG. 10 illustrates another embodiment of the controllable delay circuit 44(x) of FIG. 8. The long transmission delay circuit 54 shown in FIG. 10 includes inverter gates 84 and 86, and capacitor 90. The short transmission delay circuit 56 shown in FIG. 10, like the short transmission delay circuit 56 shown in FIG. 9, consists of only a conductor. As can be appreciated by one of ordinary skill in the art, the signal transmission delay associated with circuit 54 shown in FIG. 10 will be substantially longer than the signal transmission delay of the conductor of circuit 56.

Figure 11:
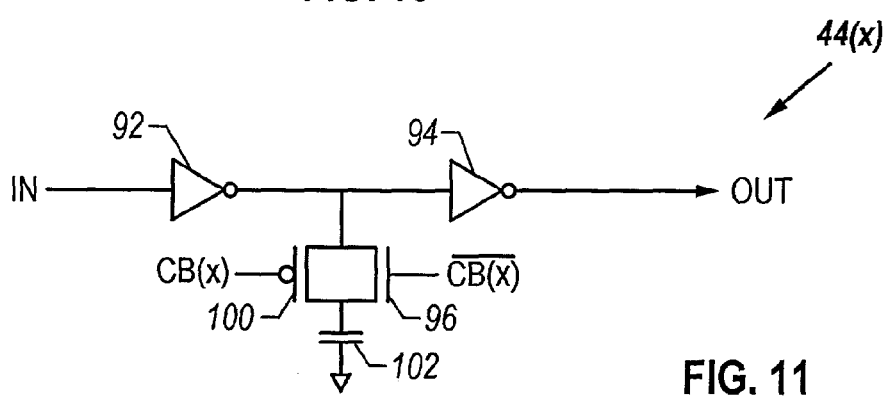
FIG. 11 illustrates another embodiment of one of the controllable delay circuits shown in FIG. 7.

FIG. 11 illustrates another embodiment of one of the controllable delay circuits 44(x) shown in FIG. 7. More particularly, the controllable delay circuit 44(x) shown in FIG. 11 includes a pair of inverting gates 92 and 94, an n-channel FET 96, p-channel FET 100, and a capacitor 102. The gate of p-channel FET 100 receives one bit CB(x) of the multi-bit variable control code, while the gate of n-channel FET 96 receives the inverse of CB(x).

Although the present invention has been described in connection with several embodiments, the invention is not intended to be limited to the specific forms set forth herein. On the contrary, it is intended to cover such alternatives, modifications, and equivalents as can be reasonably included within the spirit and scope of the invention as defined by the appended claims.

What is claimed is:

1. An apparatus comprising:
 a select circuit configured to receive a control code indicating a circuit delay for offsetting at least a portion of a transmission delay of a strobe signal;
 a delay circuit configured to receive the strobe signal and to delay the strobe signal such that transitions of the delayed strobe signal occur within a timing window for storing valid data in a memory circuit responsive to the delayed strobe signal; and
 wherein the delay circuit comprises:
  a first pair of transmission delay circuits each comprising an input and an output;
  wherein the inputs of the first pair of transmission delay circuits are coupled to receive a first signal;
  wherein individual ones of the first pair of transmission delay circuits are configured to transmit the first signal to respective outputs with distinct time delays; and
 wherein the select circuit comprises:
  a first multiplexer comprising a pair of inputs coupled to the respective outputs of the first pair of transmission delay circuits, a first multiplexer output, and a first control input configured to receive a first bit of the control code, wherein the first multiplexer multiplexes one of the outputs of the first pair of transmission delay circuits to the first multiplexer output in response to the first bit of the control code.

2. The apparatus of claim 1, wherein the delay circuit further comprises:
 a second pair of transmission delay circuits each comprising an input and an output;
 wherein the inputs of the second pair of transmission delay circuits are coupled to receive a second signal;
 wherein individual ones of the second pair of transmission delay circuits are configured to transmit the second signal to respective outputs with distinct time delays; and
 wherein the select circuit further comprises:
  a second multiplexer comprising a pair of inputs coupled to the respective outputs of the second pair of transmission delay circuits, a second multiplexer output, and a second control input configured to receive a second bit of the control code, wherein the second multiplexer multiplexes one of the outputs of the second pair of transmission delay circuits to the second multiplexer output in response to the second bit of the control code.

3. The apparatus of claim 2, wherein the delay circuit further comprises an input configured to receive the strobe signal, and an output configured to generate the delayed strobe signal, wherein the first and second stage circuits are coupled in series between the input and output of the delay circuit.

4. An apparatus comprising:
 a select circuit configured to receive a control code indicating a circuit delay for offsetting at least a portion of a transmission delay of a strobe signal;
 a delay circuit configured to receive the strobe signal and to delay the strobe signal such that transitions of the delayed strobe signal occur within a timing window for storing valid data in a memory circuit responsive to the delayed strobe signal; and
 wherein the delay circuit comprises a first stage circuit, the first stage circuit comprising:
  a first input;
  a first output;
  a first conductive node coupled between the first input and the first output;
  a first capacitor coupled to a ground node;
  a first transmission gate coupled to the first capacitor and the first conductive node and responsive to a first bit of the control code.

5. The apparatus of claim 4, wherein the delay circuit further comprises a second stage circuit, the second stage circuit comprising:
 a second input;
 a second output;
 a second conductive node coupled between the second input and second output;
 a second capacitor coupled to the ground node;
 a second transmission gate coupled to the second capacitor and the second conductive node and responsive to a second bit of the control code.

6. The apparatus of claim 5, wherein the delay circuit further comprises an input configured to receive the strobe signal, and an output configured to provide the delayed strobe signal, wherein the first and second stage circuits are coupled in series between the input and output of the delay circuit.

7. A method comprising:
 selecting a circuit delay according to a control code, the circuit delay for offsetting at least a portion of a transmission delay associated with a strobe signal;
 delaying the strobe signal by the circuit delay, wherein the delayed strobe signal comprises transitions occurring within a timing window for storing valid data in a memory circuit responsive to the delayed strobe signal; and
 wherein the delaying further comprises:
  providing a first signal to inputs of a first pair of transmission delay circuits;
  transmitting the first signal to respective outputs of the first pair of transmission delay circuits with distinct time delays; and
 wherein the selecting further comprises:
  providing the distinct time delayed first signals to respective inputs of a first multiplexer;
  providing a first bit of the control code to a first control input of the first multiplexer; and multiplexing, using the first multiplexer, one of the distinct time delayed first signals to an output thereof according to the first bit of the control code.

8. The method of claim 7, wherein the delaying further comprises:
providing a second signal to inputs of a second pair of transmission delay circuits;
transmitting the second signal to respective outputs of the second pair of transmission delay circuits with distinct time delays; and
wherein the selecting further comprises:
providing the distinct time delayed second signals to respective inputs of a second multiplexer;
providing a second bit of the control code to a second control input of the second multiplexer; and
multiplexing, using the second multiplexer, one of the distinct time delayed second signals to an output thereof according to the first bit of the control code.

9. The method of claim 8, wherein individual ones of the second pair of transmission delay circuits transmit the second signal to their respective outputs after individual ones of the first pair of transmission delay circuits transmit the first signal to their respective outputs.

10. The method of claim 7 wherein the control code is based on variable transmission delays.

11. The method of claim 7 wherein the strobe signal and the delayed strobe signal have substantially equivalent transition rates.

12. The method of claim 7 wherein the control code comprises at least one control bit, a binary value of the control bit being based on at least one of a manufacturing process variation, power supply voltage variation, and circuit temperature variation.

13. The method of claim 7 wherein the circuit delay is selected to provide one of at least a first delay and a second delay, the first delay being longer than the second delay, the first and second delays being less than a duration of the timing window.

14. An apparatus comprising:
a plurality of controllable delay circuits coupled in series, the plurality of controllable delay circuits being responsive to a control code and responsive to a strobe signal to generate a delayed strobe signal,
wherein the control code is based at least in part on a portion of a transmission delay of the strobe signal;
wherein the control code is based at least in part on a target relationship between the delayed strobe signal and at least one data signal to be stored in a memory circuit responsive to the delayed strobe signal;
wherein individual ones of the plurality of controllable delay circuits comprise:
a delay circuit configured to receive a version of the strobe signal and to delay the version of the strobe signal to generate a delayed version of the strobe signal; and
a select circuit coupled to the delay circuit and responsive to at least a portion of the control code to select a delay associated with the delayed version of the strobe signal.

15. The apparatus of claim 14 wherein the control code comprises at least one control bit and is based on fixed transmission delays.

16. The apparatus of claim 14 wherein the control code comprises at least one control bit and is based on variable transmission delays.

17. The apparatus of claim 14 wherein the strobe signal and the delayed strobe signal have substantially equivalent transition rates.

18. The apparatus of claim 14 wherein the control code comprises at least one control bit, a binary value of the control bit being based on at least one of a manufacturing process variation, power supply voltage variation, and circuit temperature variation.

19. The apparatus of claim 14 wherein the delay circuit comprises at least a first delay circuit and a second delay circuit, the first delay circuit having a longer delay than the second delay circuit, the individual delays of the first and second delay circuits being less than a duration of the timing window.

20. The apparatus, as recited in claim 14, wherein the strobe signal and the data signal are transmitted in parallel from a first circuit to a second circuit, the second circuit including the plurality of controllable delay circuits.

* * * * *